Figure 1:
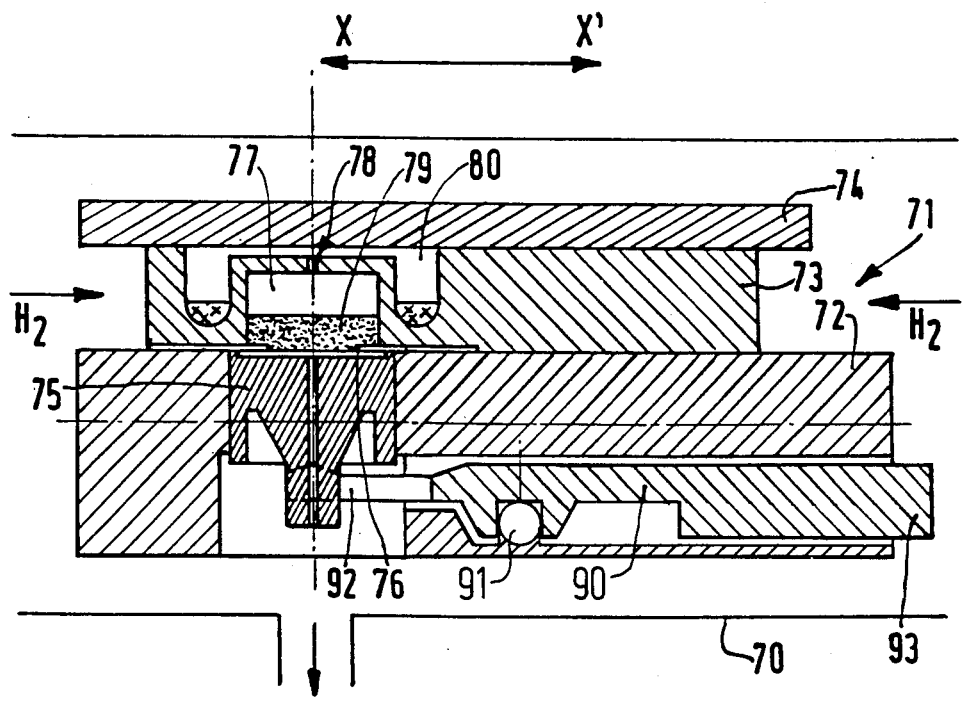

United States Patent [19]
Latorre et al.

[11] Patent Number: 4,748,932
[45] Date of Patent: Jun. 7, 1988

[54] CRUCIBLE FOR EPITAXY FROM THE LIQUID PHASE OF SEMICONDUCTOR LAYERS HAVING A "CONTROLLED" COMPOSITION

[75] Inventors: Bernard Latorre, Vincennes; Manuel Montero, Le Perreux, both of France

[73] Assignee: U.S. Philips Corporation, New York, N.Y.

[21] Appl. No.: 921,934

[22] Filed: Oct. 20, 1986

[30] Foreign Application Priority Data

Oct. 22, 1985 [FR] France ............................. 8515655

[51] Int. Cl.⁴ .......................................... H01L 21/208
[52] U.S. Cl. ..................................... 118/415; 118/421
[58] Field of Search ..................... 118/421, 412, 415; 156/621, 622, 624; 148/171, 172

[56] References Cited
U.S. PATENT DOCUMENTS 4,574,730 3/1986 Svilans ............................ 118/415 X
4,592,304 6/1986 Hager et al. ....................... 118/415

Primary Examiner—John P. McIntosh
Attorney, Agent, or Firm—Paul R. Miller

[57] ABSTRACT

The invention relates to a crucible for growing epitaxial layers having a chemical composition formed by several chemical elements, of which at least one is volatile, by the method of epitaxy from the liquid phase, comprising an elongated support (72) on which a movable part (73) slides longitudinally, with the elongated support comprising at least one recess for accommodating a substrate (76) on which at least one epitaxial layer is to be deposited. The movable part (73) comprises at least one cavity (77) receiving a mother source (79) formed by initial material for epitaxy with the cavity having on the surface adjoining the elongated support a lower opening whose dimensions correspond to the dimensions of the substrates (76) present therein. At least one receptacle (80) accommodates a source for each volatile element of the chemical composition. It is characterized in that at least one of the cavities (77) of the movable part (73), for which a substrate (76) is present below the lower opening, has at least one upper opening formed solely by a calibrated conduit (78) connected to the receptacle (80) accommodating a source of each volatile element. Each calibrated conduit (78) controls the supply of the element to the mother source by the surface of the mother source which is not in contact with the epitaxial layer. The calibrated conduit (78) maintains a substantially constant composition for the mother source.

7 Claims, 2 Drawing Sheets

CRUCIBLE FOR EPITAXY FROM THE LIQUID PHASE OF SEMICONDUCTOR LAYERS HAVING A "CONTROLLED" COMPOSITION

The invention relates to a crucible for growing epitaxial layers of chemical compounds formed by several chemical elements, at least one of which is volatile, by means of the method of epitaxy from the liquid phase, comprising an elongated support, on which a movable part slides longitudinally with the support comprising at least one recess for accommodating a substrate, on which at least one epitaxial layer is to be deposited, and the movable part comprising at least one cavity receiving a mother source formed by initial materials for epitaxy with the cavity having on the surface adjoining the support a lower opening, whose dimensions correspond to the dimensions of the substrates present therein, and at least one receptacle accomodating a source for each volatile element of the chemical compound with the crucible being intended to be arranged in a reactor brought to an epitaxial temperature.

A crucible of this kind is known from U.S. Pat. No. 4,366,771.

According to this document, it is known to form layers of $Hg_{1-x}Cd_xTe$ in a crucible of graphite constituted by two blocks, of which a first block is traversed by cavities adapted to receive sources of different compositions and this first block is movable with respect to a second block receiving the substrate. The assembly of the crucible is placed in a tubular furnace in which a flow of hydrogen circulates.

The second block receives the substrate in a recess provided therein in such a manner that the substrate is level with the second block. The thickness of the substrates used successively must therefore be calibrated as a function of the depth imparted to this recess.

The epitaxy is effected typically at a temperature of 450° C. to 500° C. for mother solutions rich in tellurium. When the required time has passed, the substrate with its epitaxial layer is separated from the liquid solution by a translatory movement. The construction of the crucible is such that the epitaxial layer is thus "wiped up", while maintaining a more or less correct surface state according to the construction of the crucible and the nature of the constituents of the layer. The thickness of the layers contributes to the clearance existing between the upper level of the substrate and the movable block containing the mother solutions.

However, in the case of the growth of epitaxial layers of $Hg_{1-x}Cd_x Te$, difficulties occur due to the high partial pressure of the mercury as compared with that of the cadium and tellurium. The mother source has a tendency to be impoverished in mercury and a constant composition of the epitaxial layers is no longer correctly ensured.

In order to obviate this problem, U.S. Pat. No. 4,366,771 describes a crucible in which the growth cavities communicate with a mercury source. These cavities traverse the first movable block and are surrounded at both surfaces by small grooves which are not very deep and are connected to each other on the upper and lower surfaces, respectively, by a prolonged part of the grooves and between the two surfaces by a hole provided in the first movable block with this hole being situated at a certain distance from the cavities. During operation, a plug is placed at the upper part of the cavity in order to obstruct the opening therein. The supply of Hg is therefore mainly effected from the upper part to the lower part of the first block through the hole so that the supplementary supply of vapours of mercury is effected at the level of the epitaxial layer in order to limit to a minimum the loss of mercury.

After the first layer has been formed, the substrate can be brought into contact with a second source to obtain a second layer having different properties.

However, according to this technique, it is not possible to correctly control the space between the finished layer and the upper block connected with the thickness of the layer, which is a parameter determinative of the wiping step, while it is not possible either to leave out of consideration of the variable tolerances with respect to the thicknesses of the substrates and to a greater extent with respect to the substrates provided already with one or several epitaxial layers. Multilayer deposits can be controlled only with great difficulty and the possibilities are very limited to carry out correctly the translation of the mobile block.

On the other hand, the construction of this crucible does not permit controlling in an effective and reproducible manner the chemical composition of the layers and more particularly the mercury content. In spite of the fact that pressure of mercury in the grooves can slightly differ from that existing above the solution, the small space existing between the first and second blocks determines the flow of mercury exchanged between the mercury source and the solution. This small space cannot be controlled from one operation to another.

Therefore, the invention has inter alia for its object to control the composition of the epitaxial layers by controlling the composition of the mother solution.

Another object of the invention is to ensure the homogeneity of this composition for the entire thickness and for the entire effective surface area of the epitaxial layer.

Therefore, the crucible as defined in the preamble is characterized in that at least one of the cavities of the movable part, for which a substrate is present before the lower opening, has at least one upper opening constituted only by a calibrated conduit, each of which is connected to the receptacle accommodating a source of each volatile element with each calibrated conduit controlling the supply of the element to the mother source.

The crucible is further characterized in that this supply is effected on the surface of the mother source which is not in contact with the epitaxial layer. It is also characterized in that the calibrated conduit controls the supply of the element to the mother source in order to substantially compensate for the losses of the element appearing at the level of the layer in order to maintain a constant composition for the mother source.

The crucible according to the invention is preferably made of graphite, but it may also be made of boron nitride or of a combination of graphite and quartz. The elevator slides with small friction into the recess of the support. The substrate, placed on the elevator, will bear on the two lips of the longitudinal groove provided in the movable part. This groove typically has a depth of 30 μm. The initial products, such as Cd, Te and Hg, for the growth of the layers of $Hg_{1-x}Cd_xTe$ are placed in a cavity of the movable part. After the crucible thus loaded has been arranged in a tubular quartz furnace, in which a reducing gas, such as hydrogen, circulates, the products become liquid at the epitaxy temperature, which for these materials is 450° C. to 500° C.

The substrate is held in contact with the liquid initial products for the duration necessary for deposition of the required thickness of the epitaxial layer, for example, half an hour for 30 μm. At the end of this duration, the movable part is displaced longitudinally on the support in the direction of the groove and the epitaxial process is then terminated. During this operation, only the edges of the substrate in contact with the lips of the grooves will have small notches, while the major central part of the epitaxial layer has an excellent surface quality.

The substrate has during the next operation an last epitaxial layer therefore always bearing on the lips of the groove, which permits controlling the mechanical clearance and hence the quality of the layers, irrespective of the thickness of the substrates used.

This bearing force is developed by a pressure system constituted by a lever. The latter has an asymmetrical structure so that with respect to an axis traversing it one of its ends will be subjected to the effect of the force of gravity and thus will lift the other end, which thus develops the required bearing force. This pressure system is made entirely of the same material as the crucible, for example of graphite, in order that pollution is avoided and an excellent behaviour at high temperature is obtained.

During the growth of epitaxial layers from the liquid phase, the constitutive elements of the material forming the epitaxial layer have natural vapour pressures, which in most cases are very different. Thus, in the case of layers of $Hg_{1-x}Cd_xTe$, the natural partial pressures of each constitutive element are for $x=0.3$:

$Cd \approx 10^{-1}$ Pa at 500° C.
$Te \approx 100$ Pa at 500° C.
$Hg \approx 10^4$ Pa at 500° C.

This results in that the liquid source will have a concentration which will vary in time.

The epitaxial layer which is formed from such a source having a non-stable concentration, will itself have a compensation which will vary in accordance with its thickness. This is detrimental to the realization of semiconductor devices having well defined properties, which are stable and reproducible.

In order to overcome these difficulties, the crucible comprises a movable part having cavities provided at their upper parts with an annular reservoir intended to receive a composition of the element in which the liquid mother solution has a tendency to be impoverished. The vapours emitted by this annular reservoir are in contact with the liquid solution contained in the cavity through at least one narrow conduit, which permits compensating for the impoverishment in the liquid mother solution by the vapour emitted from the annular reservoir.

The calibration of the conduit is determined in order that the supply of the most volatile element which it delivers compensates for the loss of the same element in the mother solution, which loss results from the leaks existing at the level of the epitaxial layer.

The layers of $Hg_{1-x}Cd_xTe$ are used to obtain the infrared detectors operating in the wavelength range of 3 to 5 μm or of 8 to 12 μm.

Figure 2:
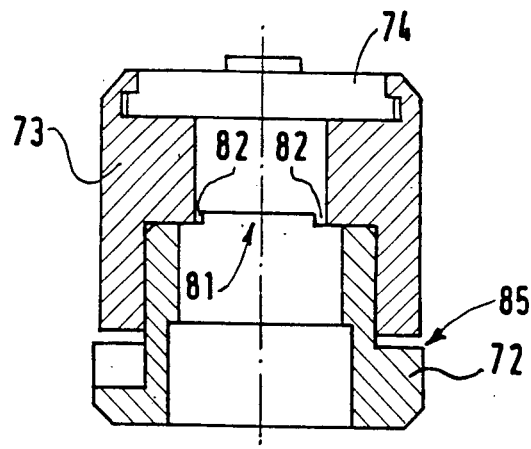
Figure 3:
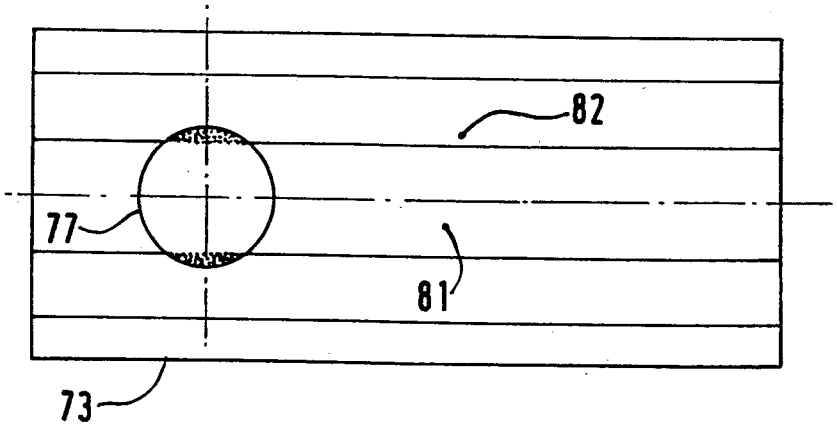

In order that the invention may be readily carried out, it will now be described more fully, by way of example, with reference to the accompanying drawings, in which:

FIG. 1 is a sectional view of a crucible according to the invention with an elevator operated by a lever, FIG. 2 is a sectional view of the crucible according to the invention, and FIG. 3 is a bottom view of the movable part of the crucible.

FIG. 1 shows an epitaxy furnace 70 generally constituted by a quartz tube surrounded by heater windings not shown. Within this furnace is arranged a crucible 71 according to the invention. It is constituted by a support 72, by a movable part 73 and by a cover 74. These three elements slide one over the other with small friction in the direction XX', which is the axis of the tube of the epitaxy furnace. For this purpose, they are provided with lateral recesses which permit their movements only in this direction.

The support 72 is recessed in order that the elevator 75 can pass, which elevator can be displaced in a direction substantially at right angles to the support 72 by means of a force developed by a pressure system described in detail hereinafter. The elevator 75 carries a substrate 76 shown on an enlarged scale in the drawing for the sake of clarity.

The movable part 73 has a cavity 77 open in the the direction of the support 72, but closed at its upper part, except for a calibrated conduit 78 which connects it to the preferably annular receptacle 80 intended to receive the growth materials at high vapour tension. The cavity 77 receives the solution rich in $Te$ prepared beforehand for the growth of layers of $Hg_{1-x}Cd_xTe$. At the epitaxial temperature, these materials form a liquid mother solution 79. The substrate 76 has a direction slightly exceeding the opening of the cavity 77 in order that this substrate cannot penetrate into it.

FIG. 2 shows a sectional view in a direction at right angles to the direction XX'. The movable part 73 has over its entire length and in the direction XX' a groove 81 of very small depth. Thus, the substrate can be in contact with the movable part 73 only through the two lateral lips 82 of the groove. In fact, when the movable part 73 is placed on the support 72, it can bear only on the two lateral lips 82 because a clearance 85 exists between the support 72 and the movable part 73.

FIG. 3 shows a bottom view of the movable part 73. The groove 81 is slightly smaller than the cavity 77 so that the lateral lips 82 of the groove 81 are not present in the cavity 77. Thus, when the movable part 73 is translated on the support 72 in the direction XX', only the surfaces of the substrate 76 which are in contact with the lips 82 will have small notches. These surfaces are indicated in FIG. 3 by a dotted line. The major central part of the substrate 76 thus remains intact.

The depth of the groove 81 is determined in the first place by the fluidity of the mother solution at the epitaxial temperatures used. In fact, it is not necessary that due to a capillary effect this mother solution can pass between the support 72 and the movable part 73. The groove has therefore to be as small as possible. A second limitation is determined by the quality of the surface state of the substrate. An acceptable surface state is, for example, that only one or two interference fringes can be seen for a substrate having a diameter of 15 mm. This is characteristic both of the surface state and of the flatness of the substrate. In order to maintain for the layers obtained a very high surface quality, a groove having a depth of 30 μm has proved satisfactory.

The very small tolerances chosen for the clearance existing between the movable part 73 and the support 72 associated with a longitudinal groove of constant depth result in that, even if the support 72 has several analogous areas for receiving several substrates, the quality of the surface state of all the layers is guaranteed.

FIG. 1 shows a crucible according to the invention, for which the pressure force is developed by a lever 90. This lever is arranged eccentrically with respect to an axis 91 so that the part 92 which is in contact with the elevator is subjected to an ascending force. This is ensured by giving the part 93 of the lever a mass larger than the part 92, for example, by influencing its form. Thus, the elevator 75 is pivoted upwards and places the substrate 76 on the lips 82 of the groove 81 of the movable part 73.

In the case of a crucible having several substrate carriers, a single lever can actuate simultaneously all the carriers by means of a rocking lever system which distributes uniformly the overall pressure force produced by the lever.

Due to the fact that the elevator 75 slides freely into the support 72, it is possible to use substrates 76 having tolerances with respect to thicknesses which are considerably less stringent than according to the prior art. Likewise, when multilayers should be obtained, the cumulated thicknesses of the layers do not disturb the manufacture of the following layers.

The process of operating the movable crucible is as follows. The quantities of the base products Cd, Te and Hg of the mother solution are determined so as to obtain the composition $Hg_{1-x}Cd_xTe$ required in accordance with the value chosen for x at a given equilibrium temperature. In the example mentioned, the masses of the mother solution are such that the height of the liquid bath is about 3 mm. In this case, the hydrodynamic behaviour of the solution is stable, i.e. the technique of small baths. This solution is placed on the support 72 and is covered by the movable part 73 so that it penetrates into the cavity 77. During this operation, the cavity 77 is situated at a certain distance from the substrate 76, which is arranged on the elevator 75. If the supply of one or several volatile elements should be controlled, i.e. in the case of $Hg_{1-x}Cd_xTe$, mercury, a compensation source, in this case Hg Te, is placed in the receptacle 80. This supply is necessary when the chemical composition of the layer of $Hg_{1-x}Cd_xTe$ should be accurately controlled. The crucible is then placed in an epitaxial furnace at 450° C. to 500° C. in a flow of hydrogen. When the crucible reaches the desired temperature, the movable part 73, which then contains the base products Cd, Te and Hg in the form of a mother solution in the liquid state, is displaced longitudinally on the support 72 so that the mother solution 79 is in contact with the substrate 76 and the growth of the epitaxial layer can begin. At the end of the epitaxial growth, the inverse operation is carried out. The movable part 73 slides on the support 72 and then the assembly of the crucible 71 is removed from the furnace. The groove 81 provided in the movable part 73 thus ensures that the surface of the epitaxial layer is perfectly wiped up. Only the two lateral parts on which bear the lips 82 of the groove 81 are slightly disturbed and consequently generally unusable. The usable central part can then be cut so as to form the semiconductor device intended to be used for infrared detection.

If other layers having different compositions should be grown, it is possible to place the substrate with its first epitaxial layer on the elevator and to utilize, as before, the cumulated thicknesses which do not form an obstacle for these new steps.

Between the movable part 73 and the support 72, leakage of material from the mother source exists, which materials are taken along by the vector gas used, in the present case hydrogen. This loss of material impoverishes the mother solution and the composition of the epitaxial source thus cannot be ensured for the entire thickness and the surface area of this layer.

The invention therefore provides for a supply of this volatile element through the calibrated conduit 78. For this purpose, it is necessary to determine the rate of leakage existing at the level of the epitaxial layer. The calibration of the conduit is therefore effected in two steps. A first step consists in determining the value of this leakage, which depends upon the characteristics of the epitaxial crucible, and more particularly upon the existence of a groove 81 such as indicated above, as well as upon the clearance 85 existing between the movable part 73 and the support 72.

The calibrated conduit 78 does not exhibit the same partial pressure at its two ends. On the side of the receptacle 80 the pressure is $P_1$, while on the side of the mother source 79 the pressure is $P_2$. These two values remain substantially constant, despite a variation of the concentrations as a function of time.

To this pressure difference corresponds in the calibrated conduit 78 a flow $F_1$ of vapours, i.e. $P_1-P_2=Z.F_1$, where Z represents the impedance of the calibrated conduit. Now it is known to those skilled in the art of the mechanics of fluids that the impedance of such a conduit is on first approximation equal to $Z=C/d^4$, where C is a constant (for a given length) and d is the diameter of the tube. It has been found that this impedance varies very rapidly with the diameter, which explains that a very high precision can be attained. Therefore, the equation follows: $P_1-P_2=C(F_1/d^4)$.

The flow $F_1$ is directly connected with the variation in time of the concentration D of the mother source plus the flow f escaping through the leakage paths at the level of the layer, i.e. $F_1=D+f$.

By means of a measure as before, it is then possible to determine the value of the flow f, which depends upon the characteristics of the construction of the assembly, and consequently control the flow $F_1$ by means of the calibrated conduit in order to obtain a substantially exact compensation of the flow f, which results in that a variation of the concentration D of substantially zero is obtained.

The first operation consists in determining the quantity of base materials forming the mother source in order to obtain the epitaxial layer of $Hg_{1-x}Cd_xTe$ with the required value x on the basis of the composition obtained with a closed tube, such as known to those skilled in the art, i.e., for example, x=0.30 being the required value. The necessary quantities of Cd, Te and Hg are then mixed. A hole calibration is chosen as function of the dimensions of the cavity 77 of the movable part 73. For a cavity having a diameter of 16 mm and a height of 10 mm, for example, a conduit is chosen formed by a hole having a diameter of 0.250 mm and a height of 3 mm. A certain quantity P of Hg Te is placed in the receptacle 80, which in the present case constitutes the mercury source. According to the epitaxial process described already, an epitaxial layer of small thickness ($\approx 10$ μm) is grown in order to obtain a substantially homogeneous composition. The layer obtained thus has a given composition x' different from the composition x required. This composition x' is determined by means of optical transmission curves as a function of the composition of the layers known to those skilled in the art, or directly by an X-ray probe.

With the crucible characteristics described above, a layer is obtained having a composition x'=0.44. The difference between the two values is : $x' - x = 0.14$.

According to the ternary diagram known to those skilled in the art, the variation dx for the compositions x and x' in question is connected with the variation of the mercury content by $dX_{Hg} \approx 0.2 \cdot dx$ for $X_{Hg} \approx 10\%$.

This permits determining the variation in composition of the mother source. In the aforementioned case with the mother solution being 2.5 g, after a few simple equations, there is obtained that the mother source has been subjected substantially to a part of 0.10 g of mercury, which permits determining the importance of the leakage at the level of the epitaxial layer. This loss occurs during the time of increase in temperature, homogeneity and growth.

For two calibrated conduits having substantially the same dimensions, the variation in pressure $P_1 - P_2$ is substantially the same, i.e.

$$F_1/d_1^4 = F_2/d_2^4$$

with
$F_1 = D_1 + f$ and
$F_2 = f$, because $D_2 = 0$.
There is obtained:

$$(D_1 + f)/d_1^4 = f_2/d_2^4.$$

The leakage is determined from the loss of weight of Hg Te in the receptacle, which gives the flow $F_1$, and from the variation of concentration of the mother source, which gives $D_1$, for a diameter $d_1$ of the calibrated conduit. Thus, the diameter $d_2$ is readily obtained, which gives a variation of concentration $D_2 = 0$ in the second case.

In the aforementioned example, a diameter $d_2 = 0.350$ mm has proved satisfactory to obtain layers with $x=0.30$. In order to obtain other compositions and for such a crucible, the diameter of the calibrated conduit lies substantially in the range of 0.1 mm to 0.5 mm.

If the first hole is badly chosen, which has the consequence that a value of dx is obtained which is relatively large with respect to x, it can prove necessary to carry out a second operation in order to obtain a suitable hole calibration.

The example just described relates to layers of $Hg_{1-x}Cd_xTe$, but the invention can also relate to other semiconductor compositions. It can then appear that several elements have high partial pressures. In this case, the crucible comprises several separated receptacles, each being connected to the mother soluton by a suitable calibrated conduit defined by the invention.

What is claimed is:
1. A crucible for growing epitaxial layers of multi-element chemical compounds by an epitaxial liquid phase technique comprising
    an elongated support having at least one recess through said elongated support, said at least one recess extending from an upper surface of said elongated support,
    at least one substrate disposed in said at least one recess with a major surface at least adjacent to said upper surface of said elongated support, said major surface receiving at least one epitaxial layer,
    a movable member disposed on said upper surface of said elongated support in a longitudinally sliding manner, said movable member having at least one cavity holding a solution of epitaxial materials, said at least one cavity having a lower opening at a lower surface of said movable member, said lower surface adjoining said upper surface of said elongated support, said lower opening having dimensions slightly less than said substrate,
    at least one receptacle accommodating a source of each volatile element for said epitaxial materials, said at least one receptacle being disposed relative to said at least one cavity of said movable member, and
    a calibrated conduit connecting said at least one cavity and said at least one receptacle, said calibrated conduit being disposed at an upper part of said at least one cavity, and said calibrated conduit controlling supply of said volatile element to said solution of epitaxial materials during growth of said at least one epitaxial layer.

2. A crucible according to claim 1, wherein said calibrated conduit supplies said volatile element through a surface of said solution opposite to said epitaxial layer.

3. A crucible according to claim 1 or claim 2, wherein said calibrated conduit maintains a substantially constant composition for said solution.

4. A crucible according to claim 3, wherein said at least one receptacle includes a peripheral recess surrounding said calibrated conduit, said peripheral recess having a surface substantially larger than a cross-section of said calibrated conduit.

5. A crucible according to claim 4, wherein said calibrated conduit has a diameter between 100 μm and 500 μm.

6. A crucible according to claim 1 or 2, wherein said calibrated conduit has a diameter between 100 μm and 500 μm.

7. A crucible according to claim 1 or claim 2, wherein said calibrated conduit has a different partial pressure at each end, said different partial pressure at each end remaining substantially constant.

* * * * *